United States Patent [19]
Ameen et al.

[11] Patent Number: 6,070,785
[45] Date of Patent: Jun. 6, 2000

[54] PROCESS FOR MANUFACTURING BOARDS THAT CAN ACCEPT A PLUGGABLE TAB MODULE THAT CAN BE ATTACHED OR REMOVED WITHOUT SOLDER

[75] Inventors: Joseph George Ameen, Newark, Del.; Joseph Funari, Vestal; Michael John Funari, Apalachin, both of N.Y.

[73] Assignee: International Business Machines Corporation, Armonk, N.Y.

[21] Appl. No.: 09/004,588

[22] Filed: Jan. 8, 1998

Related U.S. Application Data

[62] Division of application No. 08/655,363, May 29, 1996, Pat. No. 5,744,759.

[51] Int. Cl.$^7$ .................................................. B23K 20/02
[52] U.S. Cl. ...................... 228/115; 228/180.1; 228/265
[58] Field of Search ................................ 228/115, 180.1, 228/265

[56] References Cited

U.S. PATENT DOCUMENTS

| | | |
|---|---|---|
| 3,320,658 | 5/1967 | Bolda et al. . |
| 3,921,885 | 11/1975 | Knox . |
| 4,637,116 | 1/1987 | Parisch et al. . |
| 4,902,234 | 2/1990 | Brodsky et al. . |
| 4,930,001 | 5/1990 | Williams . |
| 5,024,372 | 6/1991 | Altman et al. . |
| 5,099,393 | 3/1992 | Bentlage et al. . |
| 5,186,379 | 2/1993 | Helber, Jr. . |
| 5,203,075 | 4/1993 | Angulas et al. . |
| 5,329,423 | 7/1994 | Scholz . |
| 5,498,576 | 3/1996 | Hotchkiss et al. ...................... 228/265 |

FOREIGN PATENT DOCUMENTS

| | | |
|---|---|---|
| 2643753 | 8/1990 | France . |
| 2805-535 | 8/1978 | Germany . |
| 3-1254096 | 5/1991 | Japan ................................. 228/180.1 |
| 865821 | 4/1961 | United Kingdom . |

*Primary Examiner*—Patrick Ryan
*Assistant Examiner*—Jeffrey T. Knapp
*Attorney, Agent, or Firm*—William N. Hogg

[57] ABSTRACT

The invention relates to a process for attaching a demountable flexible module to a circuit board, and includes the following steps: providing a circuit board having at least one, preferably a plurality, of gold plated metal balls disposed thereon; providing a flexible module having at least one, preferably a plurality, of gold plated vias disposed therein; positioning an elastomer stop over the circuit board; positioning the flexible module over the balls; applying pressure to the flexible module for a time sufficient to form a line contact between the gold plating on the vias and the gold plating on the metal ball of the circuit board, wherein the module is removable without heating the module. The process does not use solder to attach the module to the board, and requires substantially less than 2000 psi, and preferably less than 400 psi, to attach the module which produces little, if any, deformation to the flexible module.

8 Claims, 4 Drawing Sheets

PROCESS FOR MANUFACTURING BOARDS THAT CAN ACCEPT A PLUGGABLE TAB MODULE THAT CAN BE ATTACHED OR REMOVED WITHOUT SOLDER

This application is a division of Ser. No. 08/655,363, filed May 29, 1996 (now U.S. Pat. No. 5,744,759).

BACKGROUND OF THE INVENTION

In one typical process for manufacturing circuit boards, TAB and ATAB modules are attached to the circuit board by way of melting solder. Typically, the solder is a solder paste. The solder is reflowed at the melting point to provide the connection. Unfortunately, reflow temperatures thermally stress the various heat sensitive modules and shorten the life span of the components. Eliminating a reflow step is desirable.

Moreover, modules that are conventionally connected to solder boards are not readily removed. If a defective module requires replacement, the solder must be reflowed which creates thermal stress on the board and other components. Furthermore, TABs and ATABs are usually flexible components and present additional difficulties when connecting them to the rigid circuit board. While cold welding has occasionally been employed, it frequently requires indium alloys at high pressures such as 2,000 to 6,000 psi. Cold welded indium alloys typically corrode at the weld junction. Indium is also difficult to plate smoothly in thin layers.

Accordingly, it would be desirable to attach modules to a board without heat or indium and to be able to remove such modules without heat.

SUMMARY OF THE INVENTION

The present invention relates to a circuitized board having removable flexible modules disposed thereon. The flexible modules are mechanically and electrically connected to the board to provide an apertured connect, yet may be easily removed without using heat. The invention also relates to a circuit package and method of forming the package which package comprises a substrate and a flexible module. The substrate comprises a circuit board, a plurality of pads affixed to the circuit board, and a plurality of gold plated metal balls affixed atop the pads. The flexible module comprises a flexible dielectric member and gold plated vias disposed in the flexible dielectric member wherein at least some of the vias are positioned over the metal balls so that a line contact is made between the vias and the metal balls.

The invention also relates to a process for attaching a demountable flexible module to a circuit board, and includes the following steps: providing a circuit board having at least one, preferably a plurality, of gold plated metal balls disposed thereon; providing a flexible module having at least one, preferably a plurality, of gold plated vias disposed therein; positioning an elastomer stop over the circuit board; positioning the flexible module over the balls; applying pressure to the flexible module for a time sufficient to form a line contact between the gold plating on the vias and the gold plating on the metal ball of the circuit board, wherein the module is removable without heating the module. The process does not use solder to attach the module to the board, and requires substantially less than 2000 psi, and preferably less than 400 psi, to attach the module which produces little, if any, deformation to the flexible module.

DETAILED DESCRIPTION OF THE INVENTION

The present invention provides a circuitized board having removable flexible modules disposed thereon, which flexible modules are not attached by solder. Rather, the flexible modules are mechanically and electrically connected to the board, yet may be easily removed without using heat. The invention also relates to a process for attaching flexible modules to a circuit board which does not use the metallization of the solder or heat to attach the module to the board, and requires substantially less than 2000 psi, and preferably less than 400 psi, to attach the module. The process produces little if any deformation to the metallization of the vias in the flexible module.

Figure 1:
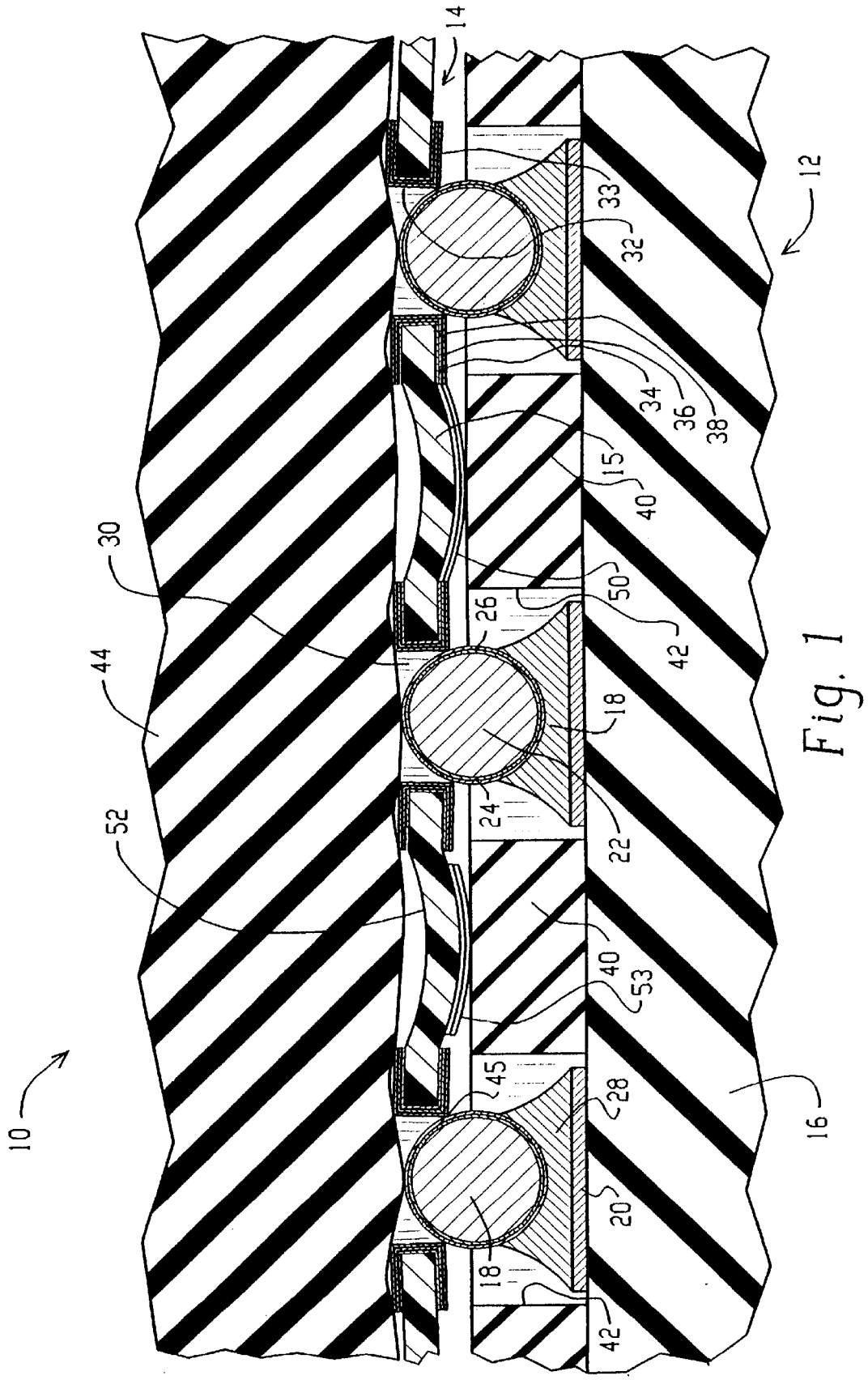
FIG. 1 is a cross section of a circuit package depicting a flexible module attached to a substrate.

Referring to FIG. 1, the package 10 is comprised of the substrate 12 and the flexible module 14 disposed on the substrate 12.

The Substrate

Figure 3:
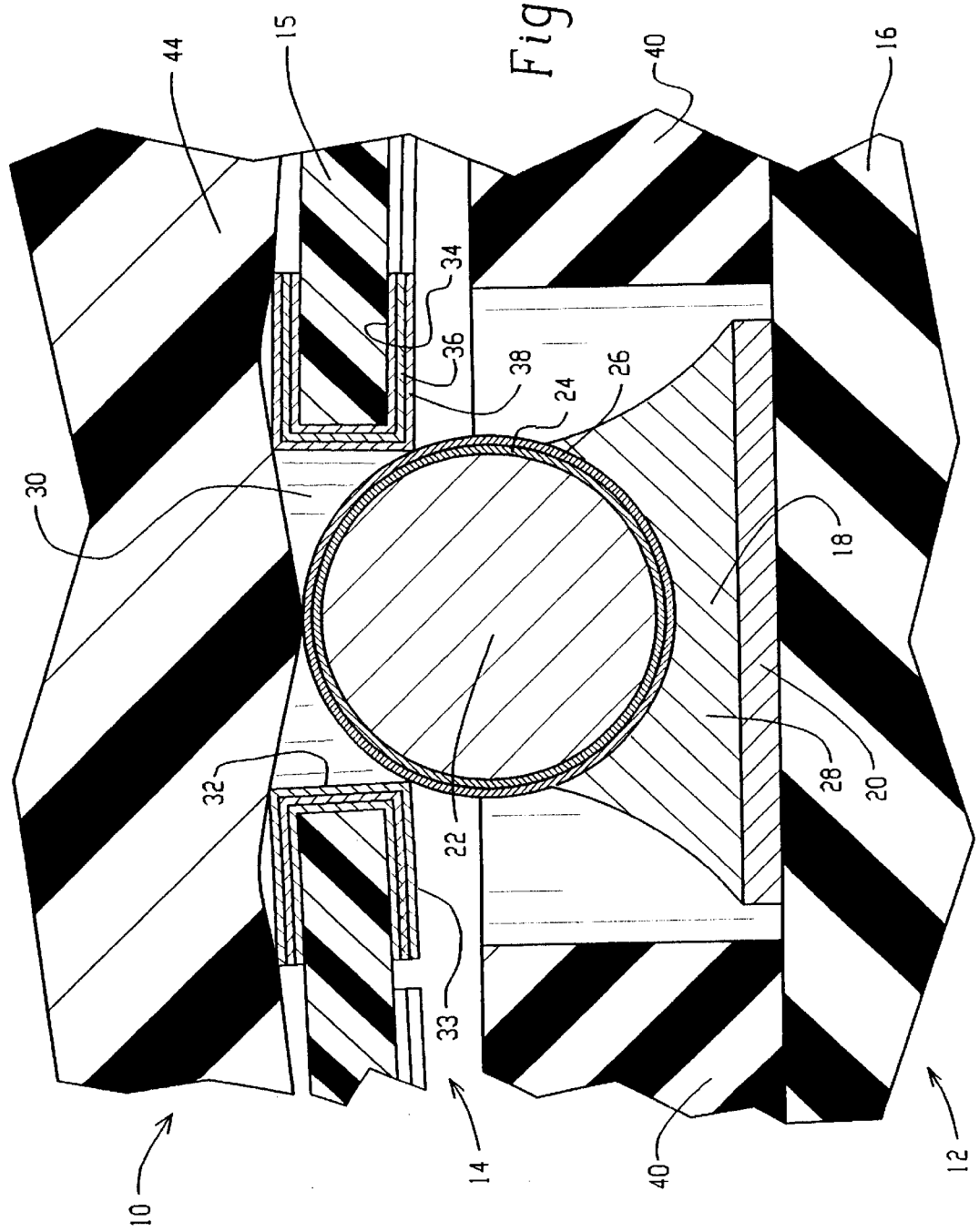
FIG. 3 is a detail of FIG. 1 showing a metal ball.
Figure 4:
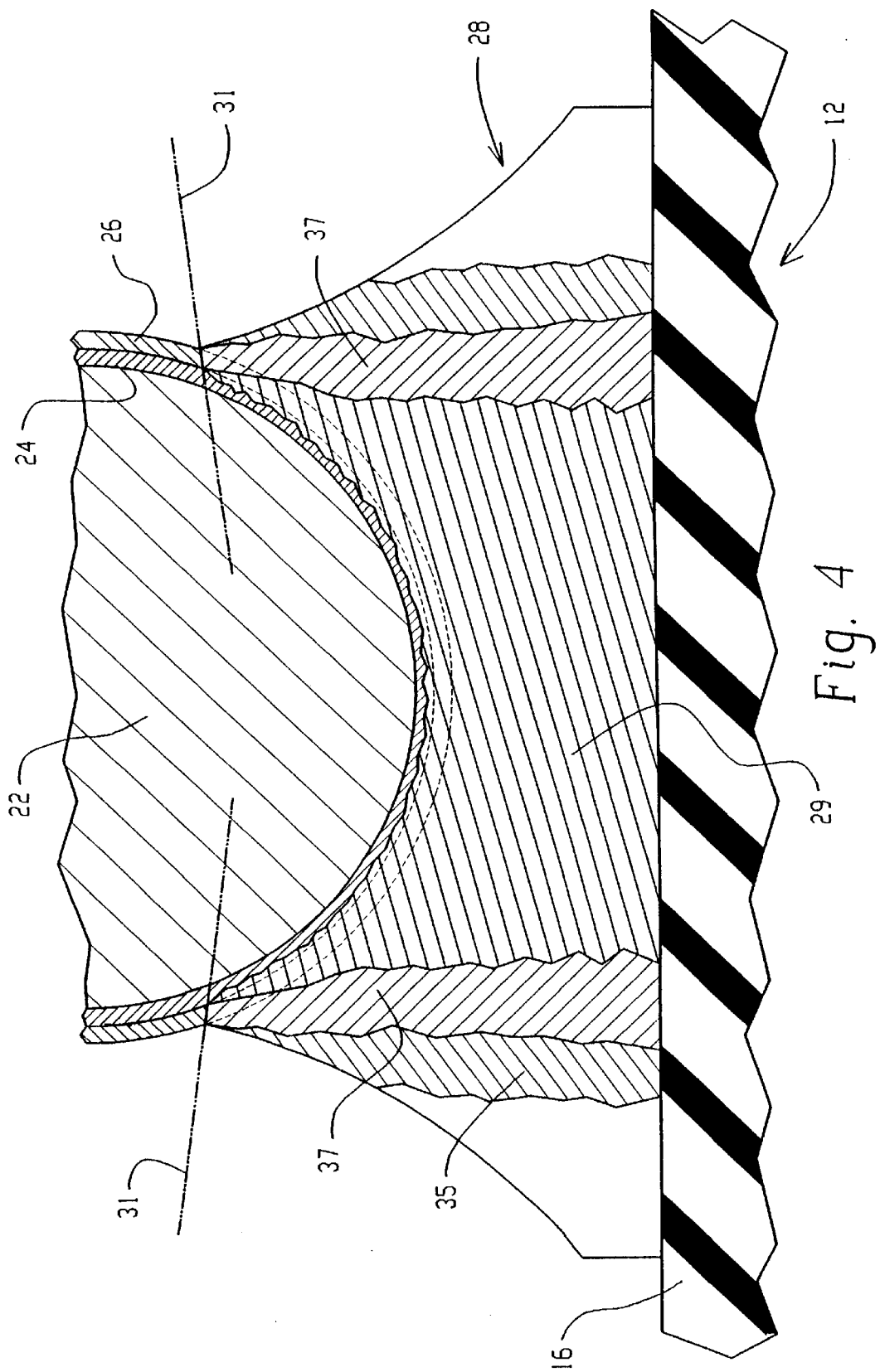
FIG. 4 is a detail of FIG. 3 showing the intermetallic areas below the metal ball.

The substrate 12 is comprised of a circuitized board 16 having metal balls 18 disposed on pads 20. The metal balls 18 are composed of metal core 22 over which a first layer of nickel 24 and then a second layer of gold 26 have been plated, as shown in FIG. 3. The second plate layer 26, which is gold, is preferably a minimum of 15 micro-inches thick. The gold plating 26 can be thicker but this will add to the cost. The first plated layer 24 is preferably nickel; chromium is not suitable because the balls will not adhere to board. Other unsuitable materials for the first plated layer 24 include tin, iron, and nickel-iron alloy. In the preferred embodiment, the solder 28 combines with gold of gold layer 26 which combines the nickel of nickel layer 24 to produce an intermetallic area 29 of tin-gold-nickel, which has good adhesion to core 22, as shown in FIG. 4. The intermetallic area 29 slows the solder 28 from climbing beyond metal line 31 which is also composed of tin, gold and nickel, and covering ball 18 with solder. Intermetallic area 35 is rich in lead, and intermetallic area 37 is rich in gold and tin.

The composition of the metal core 22 is not critical as long as the melting point is at least 200° C. higher than the melting point of the solder 28 used to attach the balls 18 to the circuit board 16. Copper is the preferred metal for the core 22 of the balls 18.

Conventional techniques are used to attach the metal balls 18 to the pads 20. For example, solder paste 28 is screened onto the pads 20. Preferably, a solder paste 28 comprised of 63% tin and 37% lead known as "63/37 solder paste" is used. Other solder pastes having different ratios or other metals are also suitable. Next, the metal balls 18 are positioned onto the solder paste 28 by conventional means. Typically, the balls 18 are placed onto special fixtures such as a ball carrier, and the fixture is positioned over the circuit board 16 so that the balls contact the solder paste 28.

Once the balls 18 are in position on the solder paste 28 on the circuit board 16, the solder 28 is reflowed by conventional means, preferably in an oven at a temperature of about 160° C. to 250° C., preferably about 180° C. to 200° C., for the 63/37 solder paste. The fixture, if present, is removed and then the metal balls 18 are cleaned to remove any oxides or dirt on the surface.

The Flexible Module

The flexible module 14, shown in FIGS. 1, is preferably a polymer tape automated bonding also referred to herein as an "ATAB" module or a tape automated bonding referred to herein as a "TAB" module. The module 14 comprises a flexible dielectric member 15, preferably a polyimide such as is sold under the trade name Kapton®. At least one preferably a plurality, of vias 30 are disposed through the flexible dielectric member 15. The walls 32 and pads 33 of the plated through holes 30 are comprised of at least two layers, and preferably three layers, of metal. The outermost layer of metal on the walls 32 and pads 33 is gold. The presence of at least two layers of metal helps to reduce stress at the interface of the plated metal and the dielectric to prevent the via walls from being ripped out of the vias 30. Preferably, the walls 32 and pads 33 of the vias 30 are plated with a layer of copper 34 to which a layer of nickel 36 is applied. The outermost layer 38 plated over the nickel layer 36 is gold; preferably the gold is 99.9% pure. The gold must be essentially chromium-free to prevent the solder from climbing onto the ball. The package 10 is further comprised of an elastomeric stop 40 disposed over the circuit board 16. Elastomeric stop 40 has holes 42 disposed therein to accommodate pads 20. Disposed over the flexible module 14 is elastomeric pad 44 which also has holes 46 to accommodate I/C chips 48. Chips 48 are connected preferably by either wire bonding or solder ball bonding. Ground plane 50 is preferably disposed on the bottom side, that is the side facing circuit board 16, of flexible dielectric member 15. The vias 30 have a smaller diameter than the balls 18. Preferably, the flexible module is not attached to any rigid member which would impose rigidity on the flexible dielectric member 15.

Attaching the Flexible Module to the Substrate

Figure 2:
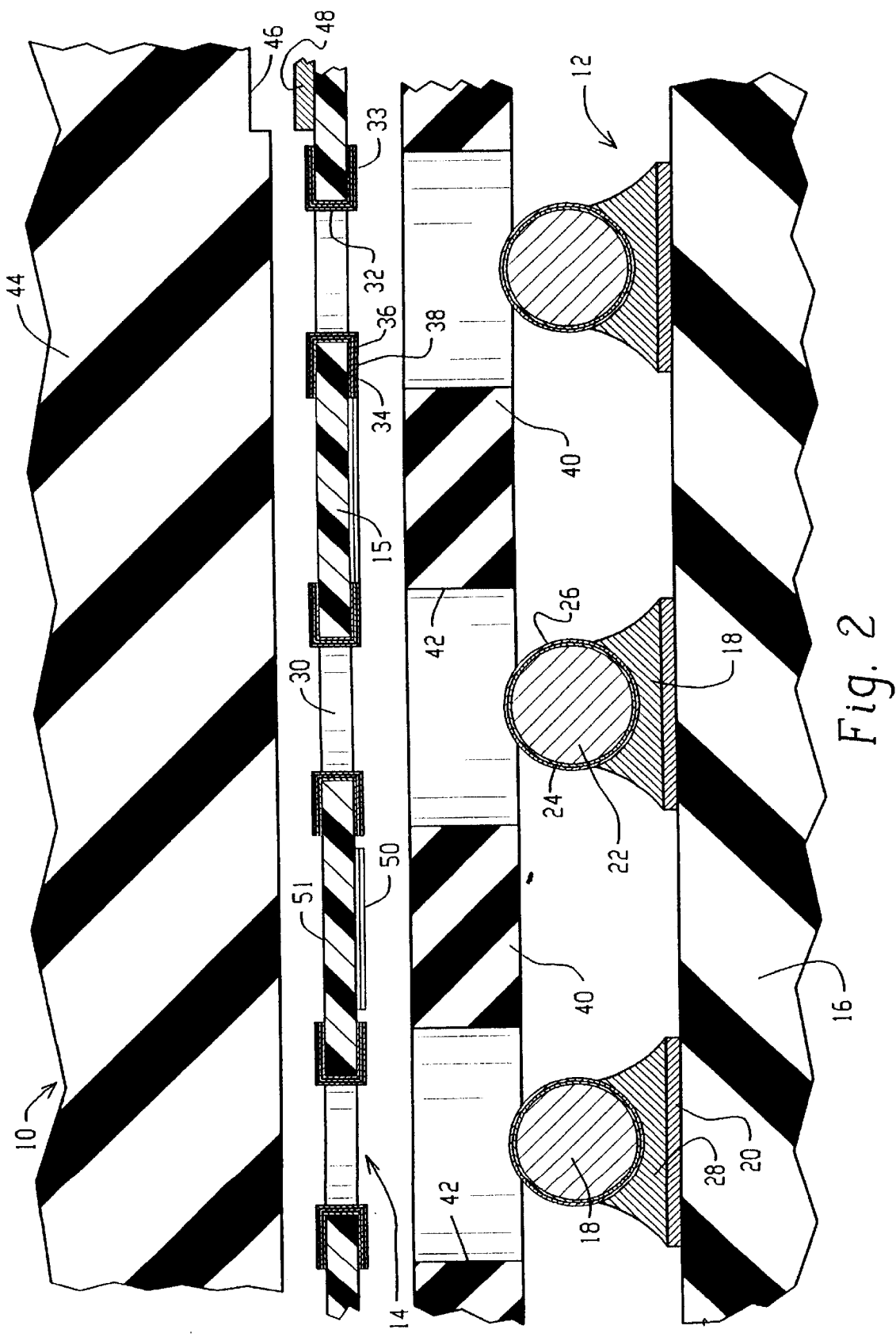
FIG. 2 is an exploded view of FIG. 1 showing the individual components assembled in the process of making the circuit package.

First, as shown in FIG. 2, elastomeric "stop" 40 is positioned on the circuit board 16; the elastomer "stop" 40 is preferably a sheet of elastomeric material that has cutouts 42 that surround the balls 18. The elastomeric stop 40 preferably has a maximum height that does not project above the center line of balls 18. Next, a flexible module 14 is positioned over the balls 18 so that the vias 30 in the module 14 are located above the balls 18.

Next, the elastomeric pressure pad 44 is placed on top of the flexible module 14. Preferably, the pad 44 has holes 46 punched out to accommodate any chips 48 disposed on the flexible module 14. The pressure pad 44 distributes uniform pressure along the top of the flexible module 14. Preferably, the pressure pad 44 is made of an elastomeric material. Good results have been obtained using a sheet of silicone rubber, preferably having a durometer value of about 60. It is highly preferred that the pressure pad 44 have a lower durometer value than the elastomeric stop 40.

Next, a device for applying pressure such as a frame, is attached so that the pressure pad 44 is pressed down over the module 14. Suitable frames include, for example, such frames as disclosed as elements 33 and 51 in U.S. Pat. No. 4,902,234, to Brodsky et. al., issued Feb. 20, 1990 and U.S. Pat. No. 5,009,393, to Bentlage et. al., issued Mar. 24, 1992, both of which are fully incorporated herein by reference. The pressure on the module 14 presses the vias 30 into contact with the gold plated balls 18 so that a line contact is made. As the balls 18 initially contact the via edge 45, the balls 18 slide over the edge 45 in a wiping action which removes surface contaminants such as oxides. A gold-to-gold contact is made after the wiping action, which results in cold fusion bonding of the gold of ball 18 to the gold of the wall 45 and/or surface 32. Preferably at least 10 g/per ball is the minimum pressure applied to each ball and preferably the maximum is 200 g/per ball.

The via walls and pads are rigid and not distorted when the line contact is made between balls 18 and the via walls and pads. Instead, the flexible dielectric member 15 is distorted or wrinkled as a result of the contact. That is, the balls 18 and vias 30 in achieving alignment, cause the flexible dielectric member 15 to buckle, to provide wrinkles 52. The wrinkles 52 permit the flexible module 14 to expand as the circuit board expands in response to heat; particularly thermal cycling. Elastomeric stop 40 supports the wrinkles 52 The elastomeric stop 40 reduces the downward deflection of the module 14, specifically wrinkles 52, when the pressure is applied. The elastomer stop 40 also preferably acts as an insulator between the ground plane 50 of the module 14 and the board 16.

Thus, during the assembly process and while the module 14 and board 16 are under pressure, the balls 18 are not distorted as occurs with conventional rigid modules. In conventional rigid modules balls distort to compensate for the variation in the size of the balls 18, the flatness of the board surface and/or the soldering process of the balls 18 to the board 16. Instead in the package 10, these tolerances are compensated by the flexure of the module 14 and the elastomer pressure pad 44 and elastomeric stop 40. The frame and pad 44 preferably remain on the structure 10 although they may be removed.

Modules 14 attached by this method are physically connected and electrically connected to the circuit board 16.

Removing the Module

First, the frame and elastomer pad 44 are removed to permit access to the module 14. The module 14 is removed such as by using a tweezers to peel the module 14 away. Preferably, a replacement module is then placed over the balls 18 and the pad 44 and frame reassembled on the structure 10. The attachment method provides for simple and easy removal of flexible module that are defective or have a defective chip.

EXAMPLE 1

A 3/16ths of an inch thick glass-epoxy multilayer circuit board having pads was provided 63/37 solder paste, from 0.005" to 0.010" thick, was screened onto the pads. Balls having a diameter of 0.0075 inches were positioned in a conventional locating fixture which was then positioned over the circuit board. The balls had 10 to 20 micro inch layer of nickel plated on copper core and a 15 micro inch minimum layer of gold plated onto the nickel. The balls were deposited onto the solder paste which has a melting point of about 160° C. The board was placed in a conventional oven at about 200° C. for about 90 seconds to reflow the solder. The board was removed from the oven and allowed to cool. An elastomeric stop composed of a sheet of silicone rubber of about 90 durometer 6 mils thickness, and having holes punched out in a pattern corresponding to the arrangement of the pads on the circuit board, was fitted onto the circuit board. The balls projected above the top surface of the elastomeric stop. A flexible ATAB having vias of 0.006 inches in diameter, was positioned over the balls so that the balls and the vias were aligned. The vias were copper over plated with 10 to 20 micro inches of nickel over which was plated a minimum of 15 micro inches of gold. An elastomeric pad made of 6 mils silicone rubber sheet having a durometer value of 90 was placed over the module. An all pad contact frame as disclosed in as elements 33 and 51 in U.S. Pat. No. 4,902,234, to Brodsky et. al., issued Feb. 20, 1990 and U.S. Pat. No. 5,009,393, to Bentlage et. al., issued Mar. 24, 1992, was assembled around/over the circuit board-module-pad and the screws tightened, using a torque wrench to 2 inch pounds. The frame remained on the board module package for 120 minutes.

The frame and pad were then removed to evaluate the circuits. The modules attached were physically connected and electrically connected to the circuit board, as determined by circuit testing. The circuit testing was done with a test light in a conventional manner.

The flexible module was then removed by hand using a tweezers and a different flexible module was attached to the board at the same location. The frame was again assembled and removed. The new module was then tested and the electrical connections verified.

Although one embodiment of this invention has been shown and described, various adaptations and modifications can be made without departing from the scope of the invention as defined in the appended claims.

What is claimed is:

1. A process for attaching a demountable flexible module on a circuit board comprising the following steps:
   a. providing a circuit board having at least one gold plated metal ball disposed thereon;
   b. providing a flexible module having at least one gold plated via disposed therethrough,
   c. positioning an elastomer stop over the circuit board;
   d. positioning the vias in the flexible module over the balls;
   e. positioning an elastomeric pressure pad over the flexible module;
   f. applying pressure to the flexible module for a time sufficient to form a line contact between the gold plating on the via and the gold plating on the ball of the circuit board, and to form wrinkles in the flexible module, wherein the module is removable without heating the module.

2. The method of claim 1 wherein less than 2000 psi is applied to the flexible module.

3. The method of claim 1 wherein the balls and the plated vias are substantially free of indium.

4. The method of claim 1 wherein the balls and the plated vias are substantially free of chromium.

5. The method of claim 1 wherein the via does not substantially deform while in contact with the solder ball.

6. The method of claim 1 wherein there are at least two vias in the flexible module and at least two gold plated balls on the circuit board.

7. The method of claim 1 wherein the pressure is applied using a frame.

8. The method of claim 1 wherein there are a plurality of vias in the flexible module and a plurality of gold plated balls on the circuit board.

* * * * *